US010928430B2

(12) United States Patent
Li et al.

(10) Patent No.: US 10,928,430 B2
(45) Date of Patent: Feb. 23, 2021

(54) HIGH PRECISION DECADE CAPACITANCE STANDARD BOX

(71) Applicant: CHENGDU KAIPU ELECTRONIC SCIENCE AND TECHNOLOGIES CO. LTD., Chengdu (CN)

(72) Inventors: Guiying Li, Chengdu (CN); Pan Jin, Chengdu (CN); Yanjun Xu, Chengdu (CN); Lin Pu, Chengdu (CN); Dian Jin, Chengdu (CN)

(73) Assignee: Chengdu Kaipu Electronic Science and Technologies Co. Ltd., Chengdu (CN)

( * ) Notice: Subject to any disclaimer, the term of this patent is extended or adjusted under 35 U.S.C. 154(b) by 165 days.

(21) Appl. No.: 16/253,606

(22) Filed: Jan. 22, 2019

(65) Prior Publication Data
US 2019/0234998 A1     Aug. 1, 2019

(30) Foreign Application Priority Data

Jan. 30, 2018    (CN) .......................... 2018100880620

(51) Int. Cl.
*G01R 27/26* (2006.01)
*H01G 4/38* (2006.01)
(Continued)

(52) U.S. Cl.
CPC ......... *G01R 27/2605* (2013.01); *G01R 35/02* (2013.01); *H01G 2/10* (2013.01); *H01G 4/38* (2013.01); *H01G 5/38* (2013.01)

(58) Field of Classification Search
CPC .... G01R 31/016; G01R 31/64; G01R 27/025; G01R 27/26; G01R 27/2605; G01R 35/02;
(Continued)

(56) References Cited

U.S. PATENT DOCUMENTS

| 4,924,173 A * | 5/1990 | Dishman | G01N 27/226 324/690 |
| 6,624,640 B2 * | 9/2003 | Lund | G01R 27/2605 324/658 |

(Continued)

FOREIGN PATENT DOCUMENTS

| CN | 101060035 A | * | 10/2007 | |
| CN | 201054305 Y | * | 4/2008 | |
| WO | WO-2012055358 A1 | * | 5/2012 | ............... H01G 2/10 |

OTHER PUBLICATIONS

IET Labs, Inc., 1413 Precision Decade Capacitor User and Service Manual.Copyright © 2003 IET Labs, Inc. (Year: 2003).*

*Primary Examiner* — Patrick Assouad
*Assistant Examiner* — Sean Curtis
(74) *Attorney, Agent, or Firm* — Andrew D. Fortney; Central California IP Group, P.C.

(57) ABSTRACT

The invention disclosed a high precision decade capacitor standard box. It comprises 6 sets of physical capacitors, 6 changeover switches, and output ports. Each set of physical capacitors include 4 physical capacitors, at least one capacitor has single-unit capacitance. The changeover switch implements the decade encoding of all the combinations of 4 physical capacitors. The changeover switch has input terminals that connect to two electrodes of physical capacitors, and output terminals that connect to the output ports of capacitor standard box to provide the selected capacitance. The capacitance values can be selected any integer from 0 to 10 times of single-unit capacitance. The decade encoding of all the combinations of 4 capacitors can reduce the number of required capacitors and wires for connecting capacitors. The open and short compensation are adopted in this decade capacitor standard, which minimizes error, improve accuracy, and is convenient for measurement, transport, and field application.

20 Claims, 5 Drawing Sheets

(51) Int. Cl.
*H01G 2/10* (2006.01)
*G01R 35/02* (2006.01)
*H01G 5/38* (2006.01)

(58) Field of Classification Search
CPC . G01R 1/203; H01G 2/10; H01G 4/38; H01G 5/38
USPC .......................................................... 324/658
See application file for complete search history.

(56) References Cited

U.S. PATENT DOCUMENTS

| | | | |
|---|---|---|---|
| 7,848,079 B1* | 12/2010 | Gordin | H01G 4/38 361/328 |
| 8,239,026 B2* | 8/2012 | Dahlberg | A61N 1/3718 607/37 |
| 9,208,944 B2* | 12/2015 | Li | H01G 2/10 |
| 10,297,378 B2* | 5/2019 | Jin | G01R 35/005 |
| 2013/0223040 A1* | 8/2013 | Li | H01G 4/38 361/816 |
| 2019/0234998 A1* | 8/2019 | Li | H01G 5/019 |
| 2019/0237249 A1* | 8/2019 | Jin | H01G 4/38 |
| 2019/0324071 A1* | 10/2019 | Poiron | G01R 21/06 |
| 2020/0119585 A1* | 4/2020 | Rodrigues Mansano | G01R 27/2605 |

\* cited by examiner

HIGH PRECISION DECADE CAPACITANCE STANDARD BOX

CROSS REFERENCE TO RELATED APPLICATION

This application claims the benefit of Chinese Patent Application No. 201810088062.0 filed on Jan. 30, 2018, incorporated herein by reference as if fully set forth herein.

FIELD OF THE INVENTION

The invention relates to the measurement, verification, and calibration of capacitance, including the standards of capacitance.

BACKGROUND OF THE INVENTION

Capacitor standards are special-made capacitors for measurement, verification, and calibration to ensure repeatable values. In RF impedance measurement, they are the standard instruments for capacitance transferring in testing and tuning of electronic circuits, can also be used as electronic sensors, and improve the accuracy of the measurement and sensor.

The normal standard capacitors are decade capacitor including physical capacitors, rotary switches, and output ports. The existing decade capacitors have a switch with 10 output connections for 10 capacitors. It needs 20 wires to connect them together. The connection of switch and capacitors has complicated structure and long wires, which introduces large parasitic into the system. Taking an example of a decade capacitor with 10 of 100 pF capacitor, the output of capacitance are listed as input connection of 10 capacitors in Table 1.

The existing capacitor standard has none of compensation available for open and short circuits. In the pre-measurement-calibration of existing RLC bridge meter, the calibration can remove only the influence of input terminal and testing cables, but not the effect of internal connection wires and rotary switches, which will result in certain error. Especially in the case of large capacitance (low impedance), the uncertainty becomes significant. The operation procedure is complicated.

SUMMARY OF THE INVENTION

This invention provides a novel design and configuration to minimize the uncertainty and improve the accuracy by utilizing the combination of 4-value capacitors and a new decade changeover switch including short and open position to realize the decade capacitor and offer compensation for both open and short circuits inside the decade capacitor standard.

The technical proposal of the invention is as follows. In order to realize the high precision decade capacitor, the innovation design and configuration includes six special changeover switches and six sets of capacitors. Each set of capacitors has 4 physical capacitors in which one capacitor has to be single unit capacitance.

The special changeover switch can encode the selection of decade capacitance values. The changeover switch has input and output terminals. The input terminals are connected to the physical capacitors. The output terminals are connected to the output ports of the capacitor standard box. The selected capacitance is connected to the output ports of the capacitor standard box. The output capacitance can be selected in 1 unit increment from 0 to 10 times of single unit capacitance for each decade changeover switch.

For each of six sets of decade capacitors, 4 physical capacitors in special designed values are employed to encode decade capacitance values. For example, if 4 capacitor values are designed in a series of 1, 2, 2, 5 of unit capacitance (e.g. 100 nF, 10 nF, 1 nF, 100 pF, 10 pF, and 1 pF), six sets of decade capacitors will have unit capacitance values respectively in 100 nF, 10 nF, 1 nF, 100 pF, 10 pF, and 1 pF; or if 4 capacitor values are designed in a series of 1, 2, 2, 5 of unit capacitance (e.g. 100 µF, 10 µF, 1 µF, 100 nF, 10 nF, and 1 nF), six sets of decade capacitors will have unit capacitance values respectively in 100 µF, 10 µF, 1 µF, 100 nF, 10 nF, and 1 nF.

The decade capacitor box has BNC connectors in 4-terminal or 3-terminal outputs. The physical capacitor includes a standard capacitor and a metal shielding case in which the standard capacitor is installed.

Two terminations of the standard capacitors are respectively connected to input H-terminal and L-terminals of changeover switch through hermetical feedthrough, and the outer shell G is soldered to the metal case as common ground.

The changeover switch is installed in metal shielding case. Inside the case a metal shielding wall is installed to divide the case and switch into two compartments for H-terminal and L-terminal compartments respectively. In H-terminal compartment, there are multiple ceramics discs, and each disc has multiple contact positions, one disc is connected to output H-terminal and other 4 discs are connected to 4 input H-terminals respectively. In L-terminal compartment, there are multiple ceramics discs, and each disc has multiple contact positions, one ceramics disc is connected to output L-terminal and other 4 discs are connected to 4 input L-terminals respectively.

The decade capacitor standard has 6 changeover switches to select capacitance values. The changeover switch can rotate 360 degree.

The changeover switch has open and short positions on one disc in both H-terminal compartment and L-terminal compartment for the compensation of short and open circuits. As shown in FIG. 6, one disc has OH and SH terminals in H-terminal compartment, and one disc has OL and SL terminals in L-terminal compartment. SH and SL are connected together for short circuit compensation, and OH and OL are unconnected for open circuit compensation.

BENEFIT OF THE INVENTION

1. The decade encoding of capacitances employs 4 capacitors and a changeover switch to realize decade capacitance output. The combination selected from 1 to 4 capacitors can output decade capacitance values. There are only 8 wires for connecting 4 capacitors to changeover switch. It significantly simplified the switch structure, and reduces the number of capacitors and connection wires comparing to existing decade capacitor standard box that have 10 capacitors. Therefore the changeover switch and decade encoding of 4 capacitors are optimized for compact size and better shielding to improve the accuracy and repeatability.
2. The changeover switch includes short and open positions within the switch structure, which enable to compensate the influence of internal connection wires and external test cables of RLC bridge meter simultaneously. This can remove all parasitic in the test system. It is easy for operation and can improve measurement accuracy and repeatability.

3. The decade encoding of all the combinations of 4 capacitors can reduce the number of required capacitors, the volume and weight of capacitor standard box, which is convenient for transport and field application.

DESCRIPTION OF DRAWINGS

1.
In FIG. 2: 2—changeover switch body, 3—Output ports, 4—Input terminals of changeover switch, 5—Output terminals of changeover switch In FIG. 3: 1—capacitor; 2—Changeover switch, 3—Outputs of decade capacitor standard box In FIG. 4: 6—Shielding metal box of capacitors, G—Ground In FIG. 6: 21—Ceramics disc switch; 22—Shielding metal box; 23—Shielding metal wall; 4—Input terminals of changeover switch; 5—Output terminals of changeover switch.

EMBODIMENTS OF THE INVENTION

Figure 1:
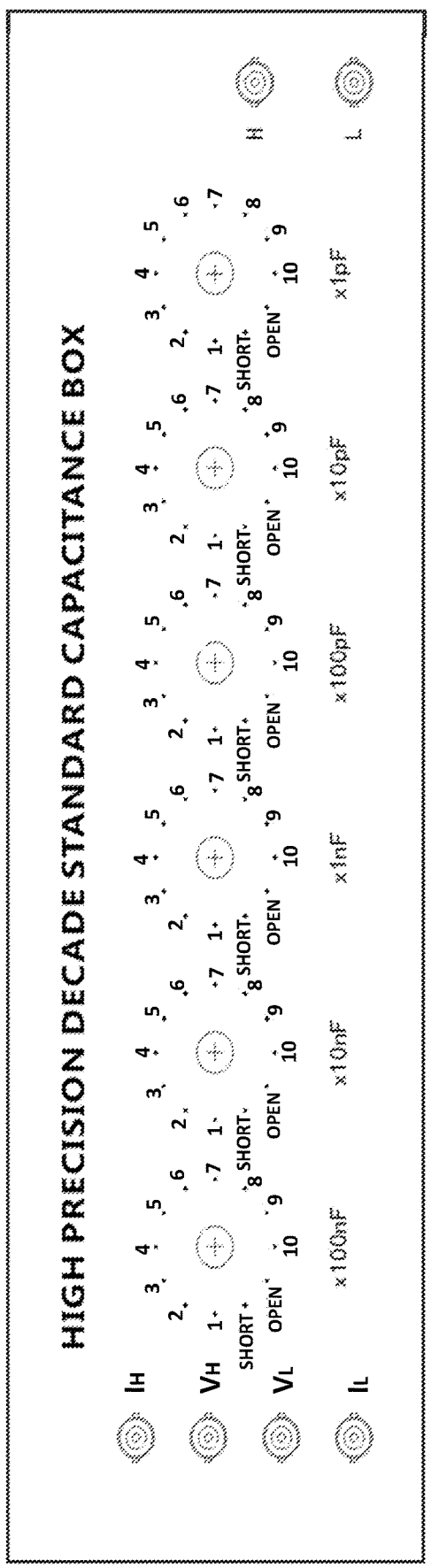
FIG. 1 is the front panel of the high precision decade capacitor standard box.
2.
Figure 2:
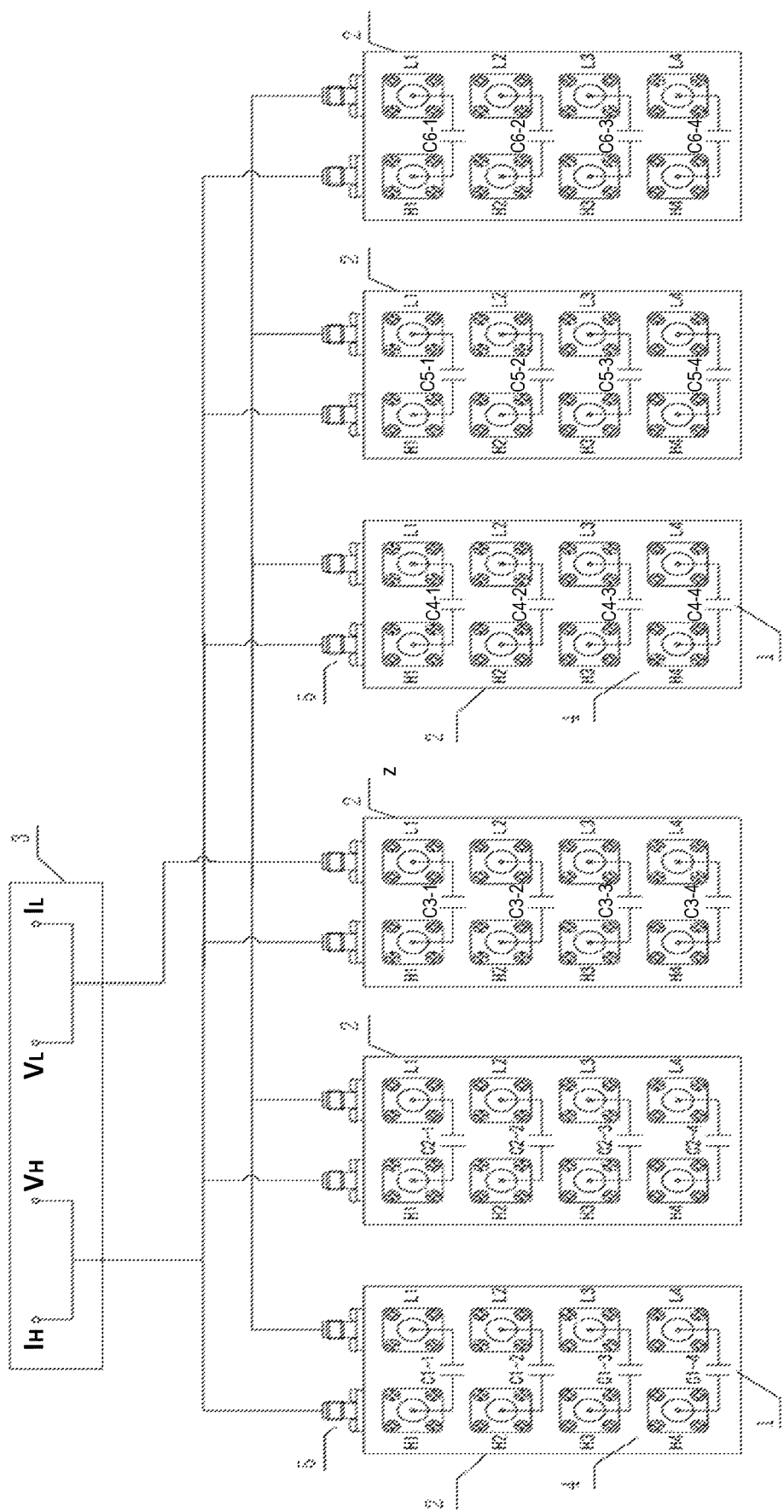
FIG. 2 is the circuit diagram of the high precision decade capacitor standard box.
3.
Figure 3:
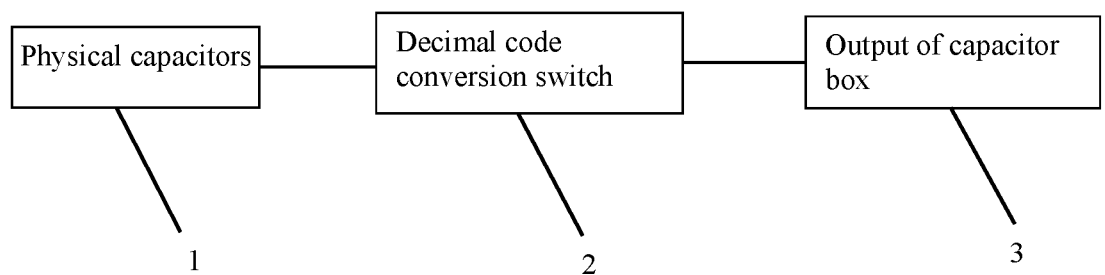
FIG. 3 is the structure block diagram of the high precision decade capacitor standard box
4.
Figure 4:
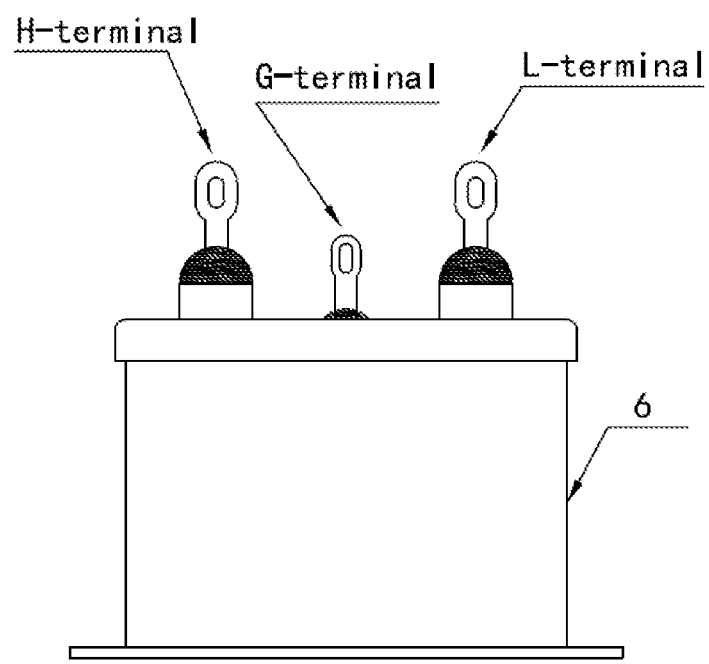
FIG. 4 is the capacitor outline of the high precision decade capacitor standard box
5.
Figure 5:
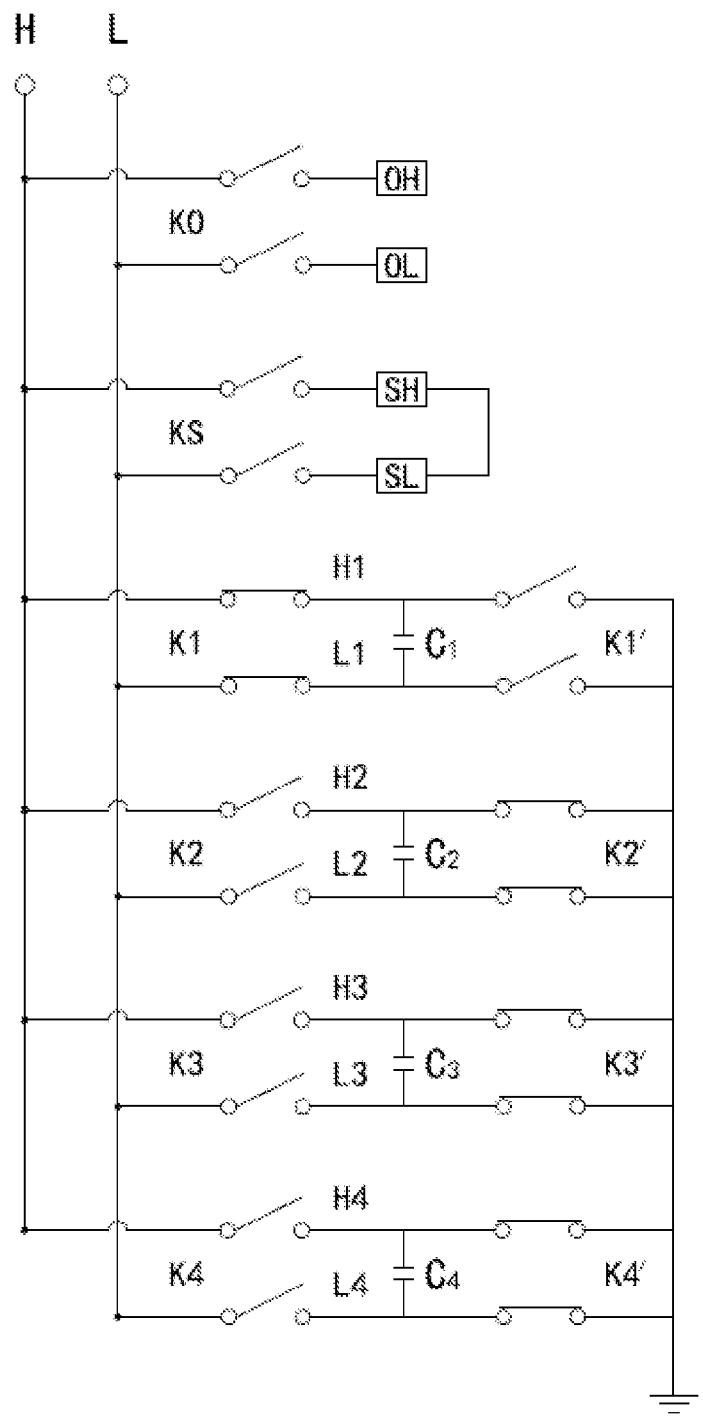
FIG. 5 is the circuit diagram of changeover switch of the high precision decade capacitor standard box
6.
Figure 6:
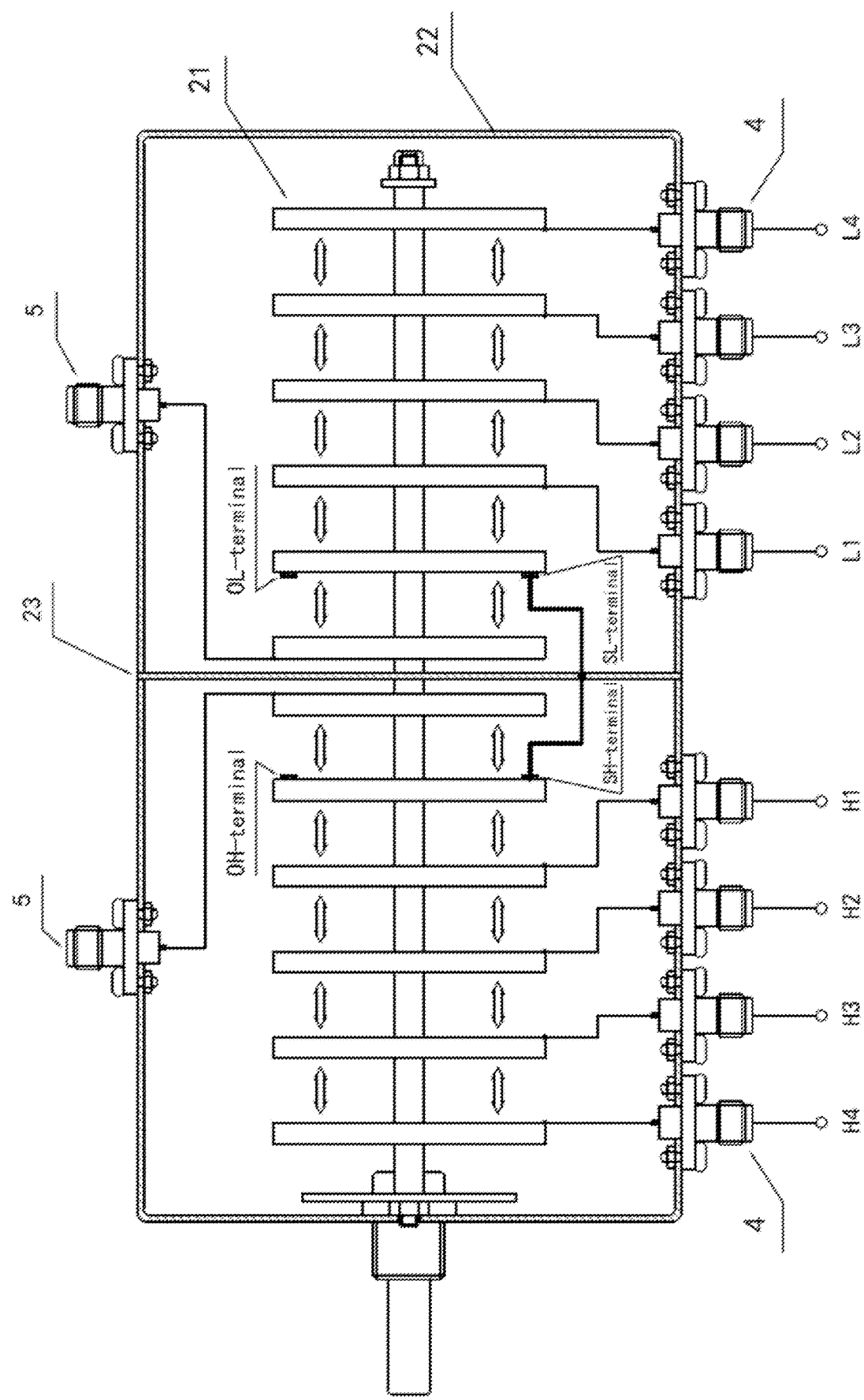
FIG. 6 is the structure of changeover switch of the high precision decade capacitor standard box Note.

The technical proposal of the invention is described in details with drawings and embodiments in this section. The application of the invention is not limited to the disclosed here. Any new application derived from this invention belongs to the invention.

The invention is a high precision decade capacitor standard box. It comprises 6 sets of physical capacitors 1, six changeover switches 2, and output ports 3. Each set of physical capacitors 1 includes four physical capacitors 1, at least one of the physical capacitor 1 is a single-unit capacitance.

The changeover switch 2 implements the decade encoding of all the combinations of 4 capacitors. The changeover switch 2 has input terminals 4 (H and L) that connect to two electrodes of physical capacitors respectively, and output terminals 5 that connect to the output ports 3 of capacitor standard box to provide the selected capacitance. The capacitance values can be selected in any integer from 0 to 10 times of single-unit capacitance.

As one example of all possible 4-capacitor sets, 4 capacitors can have a set of values as (1, 2, 2, 5) times of single-unit capacitance. This set of 4 capacitors can be encoded to output decade capacitances by changeover switch as shown in Table 2. 4 capacitors need only 8 wires for connecting them to a changeover switch. The changeover switch with simple structure can reduce the parasitic. There are other of possible 4-capacitor sets such as (1, 2, 3, 4), or (1, 1, 3, 6), etc. of single-unit capacitance that can be employed for decade capacitance output, which are protected by the invention.

The six sets of decade capacitors 1 have unit capacitances of 100 nF, 10 nF, 1 nF, 100 pF, 10 pF, and 1 pF respectively. It is easy understood that their unit capacitances can be changed according to the requirement. For example, the six sets of decade capacitors can be chosen as 100 μF, 10 μF, 1 μF, 100 nF, 10 nF, and 1 nF.

The output port 3 of decade capacitor standard employs 4-port BNC and 3-port BNC outputs, which includes H-port and L-port. The changeover switch has H-terminal and L-terminal outputs. The H-terminals and L-terminals of six changeover switches are connected respectively in parallel to the H-port and L-port outputs of capacitor standard box. Furthermore H-port output is connected to $V_H$-port and $I_H$-port outputs, L-port output is connected to $V_L$-port and $I_L$-port outputs.

The decade capacitor standard includes metal shielding case 6, and the standard capacitors are installed inside the metal shielding case 6.

Two electrodes of each capacitor are connected respectively to the H-terminal and L-terminal inputs of the changeover switch via feedthroughs, and the metal case G 6 of each capacitor is soldered to metal shielding case 6 by using a metal strip.

The changeover switch 2 comprises a metal shielding case 22, multiple-ceramics-disc switch 21. A metal wall 23 separates the metal shielding case 22 into two compartments, and divides multiple-ceramics-disc switch into two equal parts, which are used for H-terminal and L-terminal inputs respectively.

The multiple-ceramics-disc switch 21 has multiple discs in the two compartments. There is one disc to connect to the output terminal 5 in each compartment. The other 4 discs connect to the input terminals 4 respectively in each compartment. Although preferred embodiment is illustrated herein as a specific example that each disc switch is used for one capacitor input connection, other embodiments and examples, such as one disc switch being used for multiple capacitor connections may perform similar functions and/or achieve like results.

The high precision decade capacitor standard box has 6 dials that control 6 changeover switches to select the output capacitance.

The changeover switches can rotate 360° to select output capacitance values and On/Off in a step of 30°. The rotation step can be adjusted to other than 30°.

The changeover switch has a compensation function for open and short circuits. The 6 dials have two positions corresponding to the open and short status.

One ceramics disc in H-terminal compartment of the changeover switch 21 has OH and SH contact points. Another ceramics disc in L-terminal compartment of the changeover switch 21 has OL and SL contact points. SH and SL are connected together for short circuit compensation, OH and OL are unconnected for open circuit compensation. These two compensation processes can remove the parasitic from the input ports of RLC Bridge, testing cables, and internal wires and connectors of the capacitor standard. Comparing to existing compensation method, the novel design is convenient for operation, and improves the accuracy and repeatability in high precision measurement and calibration.

TABLE 1

| Output × 100 pF | | 0 | 1 | 2 | 3 | 4 | 5 | 6 | 7 | 8 | 9 | 10 |
|---|---|---|---|---|---|---|---|---|---|---|---|---|
| Input | 100 pF | 0 | 1 | 1 | 1 | 1 | 1 | 1 | 1 | 1 | 1 | 1 |
| | 100 pF | 0 | 0 | 1 | 1 | 1 | 1 | 1 | 1 | 1 | 1 | 1 |

TABLE 1-continued

| Output × 100 pF | 0 | 1 | 2 | 3 | 4 | 5 | 6 | 7 | 8 | 9 | 10 |
|---|---|---|---|---|---|---|---|---|---|---|---|
| 100 pF | 0 | 0 | 0 | 1 | 1 | 1 | 1 | 1 | 1 | 1 | 1 |
| 100 pF | 0 | 0 | 0 | 0 | 1 | 1 | 1 | 1 | 1 | 1 | 1 |
| 100 pF | 0 | 0 | 0 | 0 | 0 | 1 | 1 | 1 | 1 | 1 | 1 |
| 100 pF | 0 | 0 | 0 | 0 | 0 | 0 | 1 | 1 | 1 | 1 | 1 |
| 100 pF | 0 | 0 | 0 | 0 | 0 | 0 | 0 | 1 | 1 | 1 | 1 |
| 100 pF | 0 | 0 | 0 | 0 | 0 | 0 | 0 | 0 | 1 | 1 | 1 |
| 100 pF | 0 | 0 | 0 | 0 | 0 | 0 | 0 | 0 | 0 | 1 | 1 |
| 100 pF | 0 | 0 | 0 | 0 | 0 | 0 | 0 | 0 | 0 | 0 | 1 |

Note:
0-not connected,
1-connected

TABLE 2

| Output × 100 pF | | 0 | 1 | 2 | 3 | 4 | 5 | 6 | 7 | 8 | 9 | 10 |
|---|---|---|---|---|---|---|---|---|---|---|---|---|
| Input | 100 pF | 0 | 1 | 0 | 1 | 0 | 0 | 1 | 0 | 1 | 0 | 1 |
| | 200 pF | 0 | 0 | 1 | 1 | 1 | 0 | 0 | 1 | 1 | 1 | 1 |
| | 200 pF | 0 | 0 | 0 | 0 | 1 | 0 | 0 | 0 | 0 | 1 | 1 |
| | 500 pF | 0 | 0 | 0 | 0 | 0 | 1 | 1 | 1 | 1 | 1 | 1 |

Note:
0-not connected,
1-connected

The invention claimed is:

1. A high precision decade capacitor standard box, comprising
six sets of capacitors,
six changeover switches,
output ports,
a metal shielding case, wherein the six sets of capacitors are inside the metal shielding case, and
an outer shell welded to the metal shielding case to form a common ground; wherein
each set of capacitors includes four physical capacitors,
at least one of the physical capacitors has a single-unit capacitance, and
each of the six changeover switches implements decade encoding using any one of any combination of the corresponding four physical capacitors, and includes input terminals that connect to two electrodes of the corresponding four physical capacitors and output terminals that connect to output ports of the capacitor standard box to provide selected capacitance values in any integer from 0 to 10 times that of the single-unit capacitance.

2. The high precision decade capacitor standard box of claim 1, wherein the four physical capacitors in each of the six sets of capacitors respectively have a capacitance of 1, 2, 2, and 5 times that of the single-unit capacitance.

3. The high precision decade capacitor standard box of claim 1, wherein the single-unit capacitances of the six sets of capacitors are 100 nF, 10 nF, 1 nF, 100 pF, 10 pF and 1 pF, respectively, or 100 µF, 10 µF, 1 µF, 100 nF, 10 nF and 1 nF, respectively.

4. The high precision decade capacitor standard box of claim 1, further comprising a 3- or 4-port Bayonet Neill Concelman (BNC) connector.

5. The high precision decade capacitor standard box of claim 1, wherein the two electrodes of the corresponding four physical capacitors are respectively connected by hermetical feedthrough to the input terminals of the changeover switch.

6. The high precision decade capacitor standard box of claim 1, wherein each of the changeover switches comprises a metal case and a multiple-ceramic-disc switch inside the metal case.

7. The high precision decade capacitor standard box of claim 6, further comprising a metal wall that separates the metal case into two compartments, and divides the multiple-ceramic-disc switch into two equal parts.

8. The high precision decade capacitor standard box of claim 7, wherein a first one of the two equal parts includes first ones of the input terminals connected to one of the two electrodes of each of the corresponding four physical capacitors, and a second one of the two equal parts includes second ones of the input terminals connected to the other of the two electrodes of each of the corresponding four physical capacitors.

9. The high precision decade capacitor standard box of claim 7, wherein each of the multiple-ceramic-disc switches includes multiple discs in each of the two compartments, one of the multiple discs in each compartment connects to one of the output terminals, and other ones of the multiple discs in each compartment connect to corresponding ones of the input terminals.

10. The high precision decade capacitor standard box of claim 9, further comprising a plurality of dials configured to select an output capacitance from the six changeover switches.

11. The high precision decade capacitor standard box of claim 10, wherein the plurality of dials comprises six dials, wherein each of the six dials corresponds to a unique one of the six changeover switches.

12. The high precision decade capacitor standard box of claim 11, wherein each of the plurality of dials is rotatable 360°.

13. The high precision decade capacitor standard box of claim 10, wherein each of the plurality of dials and each of the six changeover switches is rotatable 360°.

14. The high precision decade capacitor standard box of claim 10, wherein each of the six changeover switches has a compensation function that includes an open circuit and a short circuit.

15. The high precision decade capacitor standard box of claim 14, wherein each of the plurality of dials has positions corresponding to the open circuit and the short circuit.

16. The high precision decade capacitor standard box of claim 14, wherein one of the multiple discs in each of the two compartments has open circuit and short circuit terminals, the short circuit terminals in the two compartments are connected together for short circuit compensation, and the open circuit terminals in the two compartments are unconnected for open circuit compensation.

17. A high precision decade capacitor standard box, comprising:
six sets of capacitors,
six changeover switches, wherein each of the changeover switches comprises a metal case and a multiple-ceramic-disc switch inside the metal case,
a metal wall that separates the metal case into two compartments and divides the multiple-ceramic-disc switch into two equal parts,
output ports, and
a plurality of dials configured to select an output capacitance from the six changeover switches, wherein:
each set of capacitors includes four physical capacitors,
at least one of the physical capacitors has a single-unit capacitance, each of the six changeover switches implements decade encoding using any one of any combination of the corresponding four physical capacitors, has a compensation function that includes an open circuit and a short circuit, and includes input terminals that connect to two electrodes of the corresponding four physical capacitors and output terminals that connect to output ports of the capacitor standard to provide selected capacitance values in any integer from 0 to 10 times that of the single-unit capacitance, and each of the multiple-ceramic-disc switches includes multiple discs in each of the two compartments, one of the multiple discs in each compartment connects to one of the output terminals, and other ones of the multiple discs in each compartment connect to corresponding ones of the input terminals.

18. The high precision decade capacitor standard box of claim 17, wherein a first one of the two equal parts includes first ones of the input terminals connected to one of two electrodes of each of the corresponding four physical capacitors, and a second one of the two equal parts includes second ones of the input terminals connected to the other of the two electrodes of each of the corresponding four physical capacitors.

19. The high precision decade capacitor standard box of claim 17, wherein each of the plurality of dials has positions corresponding to the open circuit and the short circuit.

20. The high precision decade capacitor standard box of claim 17, wherein one of the multiple discs in each of the two compartments has open circuit and short circuit terminals, the short circuit terminals in the two compartments are connected together for short circuit compensation, and the open circuit terminals in the two compartments are unconnected for open circuit compensation.

* * * * *